(12) United States Patent
Chang et al.

(10) Patent No.: US 8,609,253 B2
(45) Date of Patent: Dec. 17, 2013

(54) COATED ARTICLE AND METHOD FOR MAKING THE SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW); Jia Huang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 125 days.

(21) Appl. No.: 13/164,262

(22) Filed: Jun. 20, 2011

(65) Prior Publication Data

US 2012/0188628 A1 Jul. 26, 2012

(30) Foreign Application Priority Data

Jan. 25, 2011 (CN) .......................... 2011 1 0027376

(51) Int. Cl.
*G02F 1/01* (2006.01)
*C23C 14/14* (2006.01)
*C23C 14/35* (2006.01)

(52) U.S. Cl.
USPC ........... 428/472; 428/701; 428/702; 428/336; 204/192.16

(58) Field of Classification Search
None
See application file for complete search history.

(56) References Cited

U.S. PATENT DOCUMENTS

| | | | |
|---|---|---|---|
| 6,030,920 A * | 2/2000 | Karim et al. | 502/312 |
| 2007/0254159 A1* | 11/2007 | Schneider et al. | 428/411.1 |
| 2011/0095242 A1* | 4/2011 | Jin et al. | 252/583 |
| 2011/0205542 A1* | 8/2011 | Pendell Jones et al. | 356/445 |
| 2012/0171472 A1* | 7/2012 | Chang et al. | 428/336 |

FOREIGN PATENT DOCUMENTS

WO WO 2010001669 A1 * 1/2010

OTHER PUBLICATIONS

Takahashi et al. Jpn. J. Appl. Phys. vol. 40, 2001, Part I, No. 3A, p. 1391-1395.*
Sobhan et al. SPIE, vol. 2255, 1994, p. 423-434.*
Babulanam et al. Solar energy Mat., 16, 1987 p. 347-363.*
Soltani et al. Appl. Phys. Let. vol. 85, 11, 2004, p. 1958-1960.*
Roussel et al. Report, 2006, p. 1-39.*
Linke et al. Journal of Catalysis. 2002, 205, 16-31.*
Ritschel et al. Kristall und Technique, 12, 1977, 1221-1232.*
Ritschel et al. Kristall und Technique, 12, 1977, 1221-1232 (Human Translation).*

* cited by examiner

*Primary Examiner* — Vera Katz
(74) *Attorney, Agent, or Firm* — Altis Law Group, Inc.

(57) ABSTRACT

A coated article includes a substrate and a thermochromic coating formed on the substrate. The thermochromic coating is a vanadium dioxide layer co-doped M and R, where M is two or more elements selected from a group consisting of titanium, niobium, molybdenum and tungsten, R is one or more elements selected from a group consisting of rhodium, palladium and ruthenium.

4 Claims, 2 Drawing Sheets

COATED ARTICLE AND METHOD FOR MAKING THE SAME

CROSS-REFERENCE TO RELATED APPLICATIONS

The present application is related to co-pending U.S. patent application Ser. No. 13/164,270, each entitled "COATED ARTICLE AND METHOD FOR MAKING THE SAME", by Zhang et al. These applications have the same assignee as the present application and have been concurrently filed herewith. The above-identified applications are incorporated herein by reference.

BACKGROUND

1. Technical Field

The present disclosure relates to coated articles, particularly to coated articles with thermochromic property and a method for making the coated articles.

2. Description of Related Art

Vanadium dioxide ($VO_2$) materials have attracted much attention due to its thermochromic property. It is known that vanadium dioxide has a switching temperature $T_c$ in the region of 68° C. Vanadium dioxide has high transmission of infrared light when the temperature is higher than the switching temperature $T_c$, while it has high reflection of infrared light when the temperature is lower than the switching temperature T.

Since the optical switching temperature of vanadium dioxide is relatively high, various attempts have been made to lower the switching temperature of vanadium dioxide. It has been found that the switching temperature of vanadium dioxide can be reduced by doping Ti, Mo or W. However, the switching temperature of vanadium dioxide is still higher than room temperature, which limits the application of vanadium dioxide.

Therefore, there is room for improvement within the art.

BRIEF DESCRIPTION OF THE FIGURE

Many aspects of the coated article can be better understood with reference to the following figures. The components in the figures are not necessarily drawn to scale, the emphasis instead being placed upon clearly illustrating the principles of the coated article.

DETAILED DESCRIPTION

Figure 1:
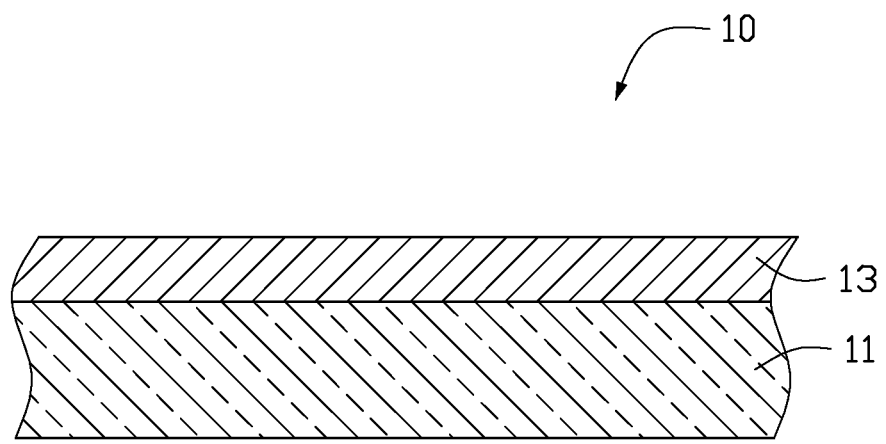
FIG. 1 is a cross-section view of an exemplary embodiment of a coated article.

FIG. 1 shows a coated article 10 according to an exemplary embodiment. The coated article 10 includes a substrate 11, and a thermochromic layer 13 formed on a surface of the substrate 11.

The substrate 11 may be made of stainless steel, aluminum alloy, ceramic or glass.

The thermochromic coating 13 is a vanadium dioxide layer co-doped with M and R, wherein M is two or more elements selected from a group consisting of titanium (Ti), niobium (Nb), molybdenum (Mo) and tungsten (W), R is one or more elements selected from a group consisting of rhodium (Rh), palladium (Pd) and ruthenium (Ru). M is preferably molybdenum or tungsten. The various elements that may comprise M and R are in compound form. M has an atomic percentage in a range from about 5% to about 10%. R has an atomic percentage in a range from about 1% to about 4%. The switching temperature of the thermochromic coating 13 is in a range of about 17° C. to about 27° C. Since the doped M ions and R ions may replace vanadium ions to destroy the bonding between V ions. This makes the vanadium dioxide be unstable, and reduces the switching temperature of the thermochromic coating 13.

The thermochromic coating 13 has a thickness of about 400 nm to about 800 nm. An environmental friendly vacuum sputtering process may form the thermochromic coating 13.

A method for making the coated article 10 may include the following steps:

The substrate 11 is pretreated. The pre-treating process may include the following steps:

The substrate 11 is cleaned in an ultrasonic cleaning device (not shown), which is filled with ethanol absolute, to remove impurities and contaminations, such as grease, or dirt.

Figure 2:
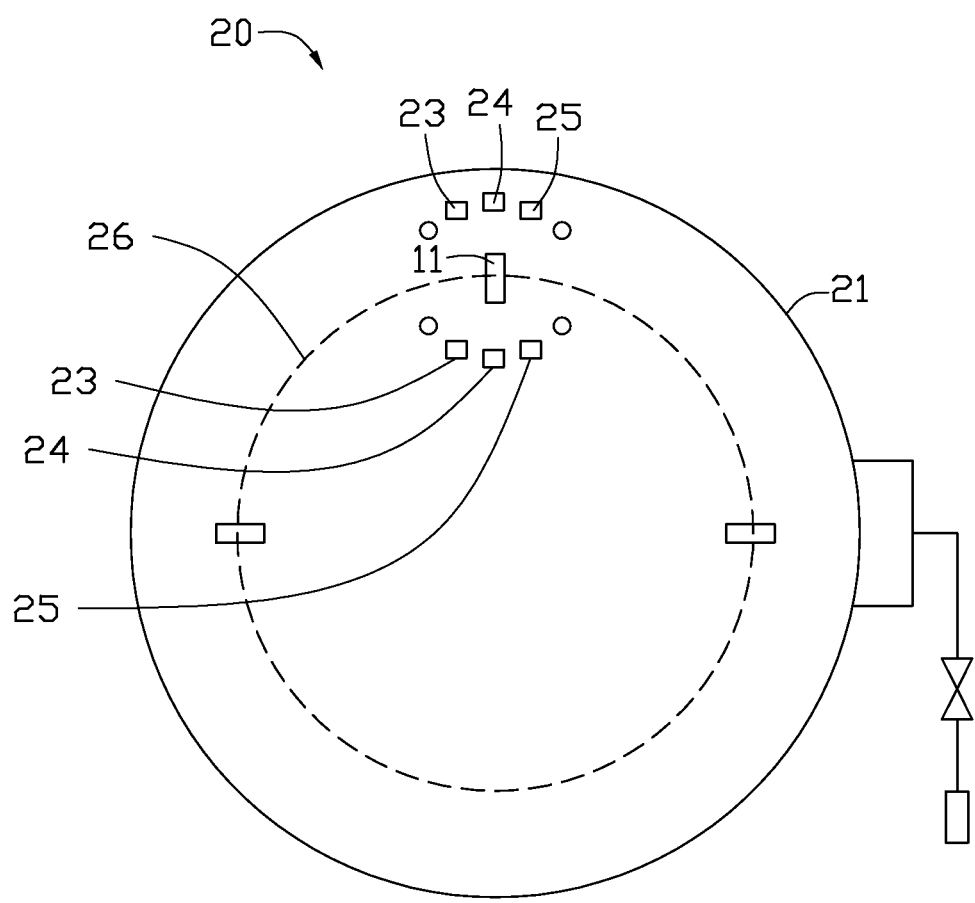
FIG. 2 is a schematic view of a magnetron sputtering coating machine for manufacturing the coated article in FIG. 1.

The substrate 11 is plasma cleaned. FIG. 2 shows a vacuum sputtering machine 20 according to an exemplary embodiment. The vacuum sputtering machine 20 includes a vacuum chamber 21. A pair of vanadium targets 23, a pair of M metal target 24, a pair of R metal target 25 and a rotary rack (not shown) are fixed in the vacuum chamber 21. The targets 23, 24, 25 are arranged in an arcuate track, and the substrate 11 is positioned at a center of the arcuate track. The rotary rack drives the substrate 11 to revolve along a circular path 26, and the substrate 11 also revolves on its own axis while revolving along the circular path 26.

The substrate 11 may be positioned in the rotary rack of the vacuum chamber 21. The vacuum chamber 21 is then evacuated to be $3.0\text{-}5.0 \times 10^{-5}$ Torr. Argon (Ar, having a purity of about 99.999%) may be used as a working gas and fed into the vacuum chamber 21 at a flow rate from about 200 standard cubic centimeter per minute (sccm) to about 400 sccm. The substrate 11 may be biased with negative bias voltage at a range of −100 V to about −300 V, then high-frequency voltage is produced in the vacuum chamber 21 and the Ar is ionized to plasma. The plasma then strikes the surface of the substrate 11 to clean the surface of the substrate 11. Plasma cleaning the substrate 11 may last for about 3-10 minutes. The plasma cleaning process enhances the bonding between the substrate 11 and the thermochromic coating 13.

The thermochromic coating 13 is vacuum sputtered on the pretreated substrate 11. Vacuum sputtering of the thermochromic coating 13 is implemented in the vacuum chamber 21 of the vacuum sputtering machine 20. The vacuum chamber 21 is heated to about 200° C. to about 300° C. Oxygen ($O_2$) is used as a reaction gas and fed into the vacuum chamber 21 at a flow rate of about 80 sccm to about 200 sccm, and Ar may be used as a working gas and fed into the vacuum chamber 21 at a flow rate of about 300 sccm to about 400 sccm. The power of the targets 23, 24, 25 fixed in the vacuum chamber 21 is then turned on and set to about 15 kw to about 10 kw. The substrate 11 may be biased with negative bias voltage to deposit the thermochromic coating 13 on the substrate 11. The negative bias voltage may be about −100 V to about −300 V. Depositing of the thermochromic coating 13 may take about 30-100 minutes. Through the above process, the thermochromic coating 13 has good thermochromic property. The coated article 10 achieved from the above method has a thickness of about 40 nm to about 60 nm. The switching temperature is in a range from about 17° C. to about 27° C.

The present disclosure is described further in detail using examples as follows, but is not limited by the following examples.

Example I

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Ti and W. The R target 25 is made of Ru. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 200° C. Ar as a working gas is adjusted at a flow rate of about 300 sccm. $O_2$ is used as reaction gas and is fed into the chamber at a flow rate of about 100 sccm. The power of the vanadium targets 23, the M metal targets 24, the R metal targets 25 was 5 kw, and the substrate 11 was biased with a negative bias voltage of −100 V. Depositing of the coating 13 may take about 45 minutes.

The M metal of the thermochromic coating 13 achieved from the first exemplary embodiment includes W at an atomic percentage of about 3% and Ti at an atomic percentage of about 2%. Ru of the R metal is at an atomic percentage of about 1%. The switching temperature of the thermochromic coating 13 is about 27° C.

Example II

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Ti and Mo. The R target 25 is made of Pd. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes. The vanadium targets 23, the M metal targets 24, the R metal targets 25 are turned on. The inside of the vacuum chamber 21 is heated to about 200° C. Ar as a working gas is adjusted at a flow rate of about 300 sccm. $O_2$ is used as reaction gas and is fed into the chamber at a flow rate of about 115 sccm. The power of the vanadium targets 23 is 8 kw, the power of the M target 24 is 8 kw and the power of the R target 25 is 6 kw. The substrate 11 was biased with a negative bias voltage of −100 V. Depositing of the coating 13 may take about 45 minutes.

The M metal of the thermochromic coating 13 achieved from the first exemplary embodiment includes Mo at an atomic percentage of about 2% and Ti at an atomic percentage of about 4.2%. Pd of the R metal is at an atomic percentage of about 1%. The switching temperature of the thermochromic coating 13 is about 23° C.

Example III

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Ti and Nb. The R target 25 is made of Pd. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 280° C. Ar as a working gas is adjusted at a flow rate of about 300 sccm. $O_2$ is used as reaction gas and is fed into the chamber at a flow rate of about 115 sccm. The power of the vanadium targets 23 is 8 kw, the power of the M target 24 is 5 kw and the power of the R target 25 is 7 kw. The substrate 11 was biased with a negative bias voltage of −100 V. Depositing of the coating 13 may take about 45 minutes.

The M metal of the thermochromic coating 13 achieved from the first exemplary embodiment includes Nb at an atomic percentage of about 3% and Ti at an atomic percentage of about 4.2%. Pd of the R metal is at an atomic percentage of about 1.5%. The switching temperature of the thermochromic coating 13 is about 24° C.

Example IV

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Mo and W. The R target 25 is made of Rh. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 110 sccm. The power of the vanadium targets 23 is 8 kw, the power of the M target 24 is 8 kw and the power of the R target 25 is 6 kw. The substrate 11 was biased with a negative bias voltage of −100 V. Depositing of the coating 13 may take about 45 minutes.

The M metal of the thermochromic coating 13 achieved from the first exemplary embodiment includes Mo at an atomic percentage of about 4% and W at an atomic percentage of about 3%. Rh of the R metal is at an atomic percentage of about 1%. The switching temperature of the thermochromic coating 13 is about 22° C.

Example V

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Ti and W. The R target 25 is made of Ru. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 125 sccm. The power of the vanadium targets 23 is 8 kw, the power of the M target 24 is 6 kw and the power of the R target 25 is 6 kw. The substrate 11 was biased with a negative bias voltage of −100 V. Depositing of the coating 13 may take about 45 minutes.

The M metal of the thermochromic coating 13 achieved from the first exemplary embodiment includes Ti at an atomic percentage of about 2% and W at an atomic percentage of about 3.5%. Ru of the R metal is at an atomic percentage of about 1.2%. The switching temperature of the thermochromic coating 13 is about 23° C.

Example VI

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Mo and Nb. The R target 25 is made of Pd. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 125 sccm. The power of the vanadium targets 23 is 6 kw, the power of the M target 24 is 8 kw and the power of the R target 25 is 6 kw. The substrate 11 was biased with a negative bias voltage of −100 V. Depositing of the coating 13 may take about45 minutes.

The M metal of the thermochromic coating 13 achieved from the first exemplary embodiment includes Mo at an atomic percentage of about 2% and Nb at an atomic percentage of about 2%. Rd of the R metal is at an atomic percentage of about 1.2%. The switching temperature of the thermochromic coating 13 is about 23° C.

Example VII

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Mo and Ti. The R target 25 is made of Rh and Ru. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 125 sccm. The power of the vanadium targets 23 is 6 kw, the power of the M target 24 is 8 kw and the power of the R target 25 is 6 kw. The substrate 11 was biased with a negative bias voltage of −100 V. Depositing of the coating 13 may take about 45 minutes.

The M metal of the thermochromic coating 13 achieved from the first exemplary embodiment includes Mo at an atomic percentage of about 2% and Ti at an atomic percentage of about 5%. The R metal of the thermochromic coating 13 includes Rh at an atomic percentage of about 1.5% and Ru at an atomic percentage of about 1.5%. The switching temperature of the thermochromic coating 13 is about 17° C.

Example VIII

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Ti and Nb. The R target 25 is made of Pd and Rh. The vacuum chamber 21 is then evacuated to about $3.0 \times 10^{-3}$ Pa. Ar is fed into the chamber at a flow rate of about 400 sccm. The substrate 11 is biased with _31 300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 150 sccm. The power of the vanadium targets 23 is 10 kw, the power of the M target 24 is 8 kw and the power of the R target 25 is 6 kw. The substrate 11 was biased with a negative bias voltage of −100 V. Depositing of the coating 13 may take about 45 minutes.

The M metal of the thermochromic coating 13 achieved from the first exemplary embodiment includes Ti at an atomic percentage of about 5% and Nb at an atomic percentage of about 4%. The R metal of the thermochromic coating 13 includes Pd at an atomic percentage of about 1% and Rh at an atomic percentage of about 2%. The switching temperature of the thermochromic coating 13 is about 20° C.

Example X

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Mo and W. The R target 25 is made of Rh and Ru. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 180 sccm. The power of the vanadium targets 23 is 8 kw, the power of the M target 24 is 6 kw and the power of the R target 25 is 6 kw. The substrate 11 was biased with a negative bias voltage of −100 V. Depositing of the coating 13 may take about 45 minutes.

The M metal of the thermochromic coating 13 achieved from the first exemplary embodiment includes Mo at an atomic percentage of about 2% and W at an atomic percentage of about 4%. The R metal of the thermochromic coating 13 includes Rd at an atomic percentage of about 1% and Ru at an atomic percentage of about 1%. The switching temperature of the thermochromic coating 13 is about 21° C.

Example XI

The vacuum sputtering machine 20 is a medium frequency magnetron sputtering device (model No. SM-1100H) manufactured by South Innovative Vacuum Technology Co., Ltd. located in Shenzhen, China. The substrate 11 was made of stainless steel. The M target 24 is made of Ti and Nb. The R target 25 is made of Rh and Ru. The vacuum chamber 21 is then evacuated to about $3.0 \times 10^{-3}$ Pa. Ar is fed into the chamber at a flow rate of about 400 sccm. The substrate 11 is biased with −300V negative bias voltage. Plasma cleaning the substrate 11 may take about 10 minutes.

The vanadium targets 23, the M metal targets 24, the R metal targets 25 are turned on. The inside of the vacuum chamber 21 is heated to about 300° C. Ar as a working gas is adjusted at a flow rate of about 300 sccm. $O_2$ is used as reaction gas and is fed into the chamber at a flow rate of about 135 sccm. The power of the vanadium targets 23 is 8 kw, the power of the M target 24 is 8 kw and the power of the R target 25 is 8 kw. The substrate 11 was biased with a negative bias voltage of −100 V. Depositing of the coating 13 may take about 45 minutes.

The M metal of the thermochromic coating 13 achieved from the first exemplary embodiment includes Ti at an atomic percentage of about 2% and Nb at an atomic percentage of about 5%. The R metal of the thermochromic coating 13 includes Rd at an atomic percentage of about 1.5% and Ru at an atomic percentage of about 1.5%. The switching temperature of the thermochromic coating 13 is about 23.5° C.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article comprising:
   a substrate; and
   a thermochromic coating formed on the substrate;
   wherein the thermochromic layer is a vanadium dioxide layer co-doped with M and R, where M is two or more elements selected from a group consisting of titanium, niobium, molybdenum and tungsten, and R is one or more elements selected from a group consisting of rhodium and palladium wherein M of the thermochromic layer has an atomic percentage in a range from about 5% to about 10%, R of the thermochromic layer has an atomic percentage in a range from about 1% to about 4%.

2. The coated article as claimed in claim 1, wherein the substrate is made of stainless steel, aluminum alloy, glass or ceramic.

3. The coated article as claimed in claim 1, wherein the thermochromic layer is made by magnetron sputtering process.

4. The coated article as claimed in claim 1, wherein the thermochromic layer has a thickness in a range of about 400 nm to about 800 nm.

* * * * *